(12) United States Patent
Wang et al.

(10) Patent No.: US 7,727,798 B1
(45) Date of Patent: Jun. 1, 2010

(54) METHOD FOR PRODUCTION OF DIAMOND-LIKE CARBON FILM HAVING SEMICONDUCTING PROPERTY

(75) Inventors: Sea-Fue Wang, Taipei (TW); Jui-Chen Pu, Taipei (TW); Chia-Lun Lin, Taipei (TW); Fu-Ting Hsu, Taipei (TW); Kai-Hung Hsu, Taipei (TW); Yu-Chuan Wu, Taipei (TW); Shea-Jue Wang, Taipei (TW); Chien-Min Sung, Taipei (TW); Shao-Chung Hu, Taipei (TW); Ming-Chi Kan, Taipei (TW)

(73) Assignee: National Taipei University Technology, Taipei (TW)

( * ) Notice: Subject to any disclaimer, the term of this patent is extended or adjusted under 35 U.S.C. 154(b) by 0 days.

(21) Appl. No.: 12/360,333

(22) Filed: Jan. 27, 2009

(51) Int. Cl.
*H01L 21/00* (2006.01)

(52) U.S. Cl. .................. 438/105; 257/E21.041

(58) Field of Classification Search .......... 438/105; 257/E21.041
See application file for complete search history.

(56) References Cited

U.S. PATENT DOCUMENTS

| | | | |
|---|---|---|---|
| 5,635,258 A | | 6/1997 | Chen et al. |
| 5,926,771 A | * | 7/1999 | Brown .................. 588/318 |
| 5,928,771 A | * | 7/1999 | DeWald et al. .......... 428/216 |
| 6,939,794 B2 | | 9/2005 | Yin et al. |
| 7,144,753 B2 | | 12/2006 | Swain et al. |
| 7,223,442 B2 | | 5/2007 | Sidorova et al. |
| 7,393,717 B2 | | 7/2008 | Gluche et al. |
| 2009/0020153 A1 | * | 1/2009 | Sung .................. 136/255 |
| 2009/0226718 A1 | * | 9/2009 | Hasegawa et al. ......... 428/338 |
| 2010/0024873 A1 | * | 2/2010 | Mahrize .............. 136/255 |

FOREIGN PATENT DOCUMENTS

| | | |
|---|---|---|
| TW | 591131 | 6/2004 |
| TW | 594853 | 6/2004 |

* cited by examiner

*Primary Examiner*—W. David Coleman
*Assistant Examiner*—Christine Enad
(74) *Attorney, Agent, or Firm*—Schmeiser, Olsen & Watts LLP

(57) ABSTRACT

Method for production of diamond-like carbon film having semiconducting properties comprises preparing a boron-doped diamond-like carbon (B-DLC) thin film on a silicon substrate through a radio frequency magnetron sputtering process, wherein a composite target material formed by inserting boron tablet as a dopant source in a graphite target is used. After forming a boron-containing diamond-like carbon film, the thin film is annealed at a temperature of 500° C. and kept at this temperature for 10 minutes, and determine its carrier concentration and resistivity. Thus demonstrated that the polarity of said boron-doped diamond-like carbon film is p-type semiconductor characteristic. Carrier concentration can be up to 1.3×1018 cm-3, and its resistivity is about 0.6 Ω-cm; consequently. The boron-doped semiconducting diamond-like carbon film having excellent semiconductor property and high temperature stability according to the invention is best applicable in solar cell or electronic communication and electrode elements and equipments.

14 Claims, 3 Drawing Sheets

METHOD FOR PRODUCTION OF DIAMOND-LIKE CARBON FILM HAVING SEMICONDUCTING PROPERTY

BACKGROUND OF THE INVENTION

1. Field of the Invention

The invention relates to a method for production of diamond-like carbon film having semiconducting property, and in particular, to a technique for developing materials useful for a semiconducting diamond-like carbon film and the associated technique for designing its production process and the target raw material used. The invention also relates to a diamond-like carbon semiconductor and to its use in electronic and photoelectric devices and elements such as wires and electrodes in the solar cell, semiconducting elements, and the electronic components.

2. Description of the Prior Art

Diamond film and diamond-like carbon exhibit predominantly high visible and infrared (IR) transmission, high mechanical strength, high electric resistance, and resistance to corrosive gas or other medium, and consequently, they can be used as highly protective materials and anti-reflective coatings. Owing to the energy crisis, research in thin-film solar cells has attracted much attention. Among materials useful in solar cells, silicon crystals have unique semiconducting characteristics and therefore they can be used in semiconducting elements and solar cells. On the other hand, diamond materials although have atomic structure similar to that of silicon crystals, they belong inherently to an insulating material. Accordingly, a number of researchers have attempted to change the electrical property of diamond material into semiconducting or conducting nature by means of doping techniques so as to favor the application and development of diamond materials. Among those attempts, changing electric resistance of diamond film or diamond-like carbon (DLC) film by means of doping could make it possible for diamond film or diamond-like carbon film being applicable in semiconductor or electrical elements. Methods for lowering electric resistance of diamond film or diamond-like carbon included doping of hydrogen phosphide or diborane, blending to form metal film, nitrogen infiltration during film deposition and the like.

At present, most of the commonly used diamond films or diamond-like carbon films having semiconducting property are produced by processes or equipments based on chemical vapor deposition (CVD). However, in the production by CVD, it is indispensable to use expensive equipment and toxic or inflammable alkane gases to form and produce diamond film or diamond-like carbon film through high temperature reaction. In contrast to this, it is desirable to provide a method for the production of semiconducting diamond-like carbon film without using high temperatures, chemical reactions and toxic or inflammable gases.

Conventional techniques for producing diamond-like carbon thin film and diamond thin film having semiconducting properties can be summarized as following:

1. U.S. Pat. No. 7,393,717 disclosed fabrication of electric resistance and contact connection electric resistance regions, wherein the electric resistance region comprised conductive diamond. The electric resistance region was an electric resistance layer consisting of a small part of non-conductive diamond placed on the top of a substrate. The deposition of the diamond was carried out by CVD; microwave plasma enhanced chemical vapor deposition (MWPECVD), Hot Filament CVD or hydrogen/methane plasma. The diamond comprised a dopant therein in a manner that the diamond could become a p-type semiconductor. The dopant comprised at least one of the following components: boron, sulfur, phosphorus, diamond-like carbon (DLC), lithium, hydrogen, nitrogen or graphitic carbon ($sp^2$-bonded carbon).

2. U.S. Pat. No. 7,223,442 disclosed a process for preparing diamond-like carbon nanocomposite thin film doped with basic elements such as carbon, silicon, metals, oxygen and hydrogen. The preparation process for the thin film could be described as follows: a substrate was placed in a vacuum chamber and the film was deposited under an external bias on the substrate of 0.3~0.5 kV; as the gas plasma discharged, its carbon particles generated a plasma energy density of more than 5 kW-h/g-atom and were vaporized together in admixture with organic compounds into the plasma; the dopant particle beam was guided into the plasma; and a thin film was thus grown on said substrate to form a conductive nanocomposite thin film doped with carbon, wherein atomic concentrations of carbon, metal and silicon thereof were identical to a previous verified ratio. Said thin film was coated with a silicon dioxide layer. Passing a uni-directional electric current over the thin film could result in heat generation on the thin film. A nanocomposite thin film that had been doped with diamond-like carbon and had a multi-layer structure was thus prepared.

3. U.S. Pat. No. 5,635,258 disclosed a process for preparing boron-doped diamond thin film by microwave plasma chemical vapor deposition (MP-CVD). The binary reaction gas system used in the process had a composition of $C_xH_y$—$CO_2$ and $C_xH_yO_z$—$CO_2$. The dopant used therein was trimethyl borate.

4. Taiwan Patent No. 594853 disclosed a method for producing diamond film by CVD. On the surface of the substrate, a dopant layer was formed by coating a solution of boron, di-boron tri-oxide, boron nitride and the like on the substrate, or by sputtering a solid state target material. Its last step comprised a heat treatment.

5. Taiwan Patent No. 591131 disclosed a method for producing diamond film by CVD. In this method, a gas mixture formed from $B(OCH_3)_3$ gas and raw material gases, using boron in the gases as the dopant, was deposited on a substrate through gas phase reaction to form diamond film; wherein the volume concentrations of $B(OCH_3)_3$ gas and the raw material gas were set to be in the range of 0 Vol. % to 8 Vol. %.

6. U.S. Pat. No. 6,939,794 disclosed a hard photomask consisting of boron-doped non-crystalline carbon, as well as a method for producing said photomask. The non-crystalline carbon photomask could provide improved corrosion resistance against various materials. Said boron-doped non-crystalline carbon thin film was prepared by PECVD. A semiconductor substrate such as a semiconductor wafer was used as a substrate, the chamber temperature was set in the range of 400° C. to 650° C., and propylene gas was introduced at a flow rate in the range of 300 sccm to 1500 sccm. At the same time, diborane gas was introduced at a flow rate in the range of 100 sccm to 2000 sccm. During the introduction of the propylene gas, the power was adjusted in the range of 100 W to 1000 W, and the pressure was set in the range of 0.4 Ton to 0.8 Ton.

7. U.S. Pat. No. 7,144,753 disclosed a nano-scale boron-doped diamond crystal having electric conductivity. The boron-doped diamond used boron within the crystal as the charge carrier. The diamond was used most effectively in the redox reaction of the electrochemical electrode, as well as in the elimination of aqueous solution. This patent revealed that doping of boron element can change the electrically insulating property of a diamond material into an electronic feature of an electric conductor.

It is apparent that these prior attempts to incorporate hetero-elements into a diamond material to change the semiconducting characteristics of said diamond material to achieve a semiconducting property with high carrier concentration. Further, the preparation processes involved were mostly based on the synthesis of diamond material through chemical vapor deposition (CVD). The doping elements used therein come largely from the gaseous phase of trimethyl borate ($B(OCH_3)_3$) or methyl borate ($C_3H_9BO_3$). In most cases, the doping gas was mixed with raw material gas and then the purpose of doping was achieved through a synthetic reaction process. Finally, diamond materials or diamond-like film was synthesized in manner using chemical vapor. It was apparent that conventional techniques employed expensive equipment for chemical vapor synthesis, and since they used mostly reactants in gaseous states, there were unfavorable factors such as parameter instability, danger involved in high temperature chemical reactions during synthesis and the like.

In summary, conventional and current techniques are not ideal and need to be improved urgently.

The inventor had learned the various disadvantages derived from conventional methods and devoted to improve and innovate, and finally, after studying intensively for many years, had developed successfully a method for producing diamond-like carbon film having semiconducting property and thus accomplished the invention. Accordingly, the semiconductor expected to be developed by the invention can be produced by a magnetron sputtering process under conditions without high temperature, chemical reactions and in the absence of inflammable or toxic gas. Further, said semiconductor can be a p-type semiconducting diamond-like carbon film (p-DLC). There has never been described a means to produce a p-type semiconducting diamond-like carbon film (p-DLC) by means of RF magnetron sputtering. Boron doping in this type of diamond-like carbon film production process can be demonstrated as the first-step of development in the semiconducting diamond-like carbon film and thereby is expected to enable the semiconducting electricity of the diamond-like carbon film to be better than that of diamond thin film. The Boron element is the most logical element to be doped in a diamond, since the atomic radius of boron is similar to that of carbon, which renders boron to substitute and infiltrate into the structure of diamond without significantly deforming its crystal lattice. In addition, it can be confirmed that the product is a p-type doped semiconducting diamond (p-Diamond), and thereby can greatly enhance the electrical properties of diamond thin film. Accordingly, the invention results in doping of boron in the coating of a diamond-like carbon film through radio frequency (RF) magnetron sputtering, whereby the surface area ratio of carbon target to boron tablet is used as a parameter to determine the influence of the doping level on the electric property of the semiconductor.

SUMMARY OF THE INVENTION

A method for production of diamond-like carbon film having semiconducting property can be carried out by a physical vapor deposition including magnetron sputtering and cathodic arc deposition. In a preferred embodiment, the inventive method comprises a magnetic-controlled sputtering process, wherein a composite target material useful for sputtering is formed from solid state graphite target material and boron tablet. The boron tablet is inserted in the graphite target material. A diamond-like carbon film was deposited through co-sputtering and at the same time, accomplish the doping of boron element. Therefore, the boron element is doped into the diamond-like carbon film during the preparation process of the said thin film material. Consequently, the boron element obtain a diamond-like carbon film having p-type semiconducting property as well as a high carrier concentration, which makes said semiconducting diamond-like carbon film extremely favorable for application as a material in semiconductor field. Further, as said semiconducting boron-doped diamond-like carbon film is compared with a diamond-like carbon film without boron doping under semiconducting property measurement, said boron-doped diamond-like carbon film behaves as a p-type semiconductor thin film. Furthermore, doping boron in the thin film is confirmed by X-ray Photoelectron Spectroscopy (XPS) analysis. The current bottleneck in nano-scale semiconductor materials, specifically carrier concentration in the semiconductor, mobility of the carrier, and the heat dissipation performance can be overcome by the inventive semiconducting diamond-like carbon film.

DETAILED DESCRIPTION OF THE PREFERRED EMBODIMENT

Figure 1B:
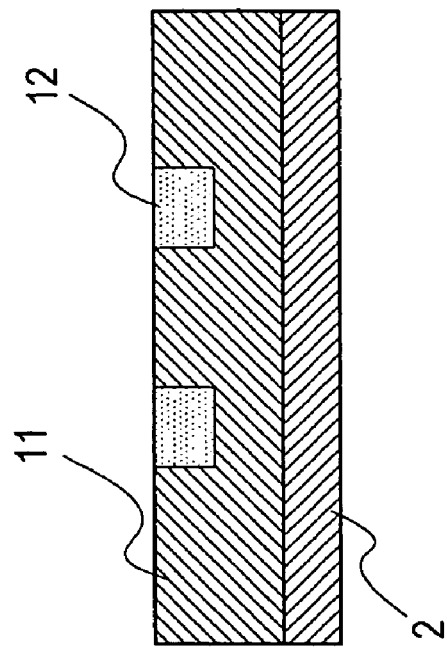
FIGS. 1A and 1B are structural views of the composite target material used in the method for production of the inventive diamond-like carbon film having semiconducting property.
Figure 1A:
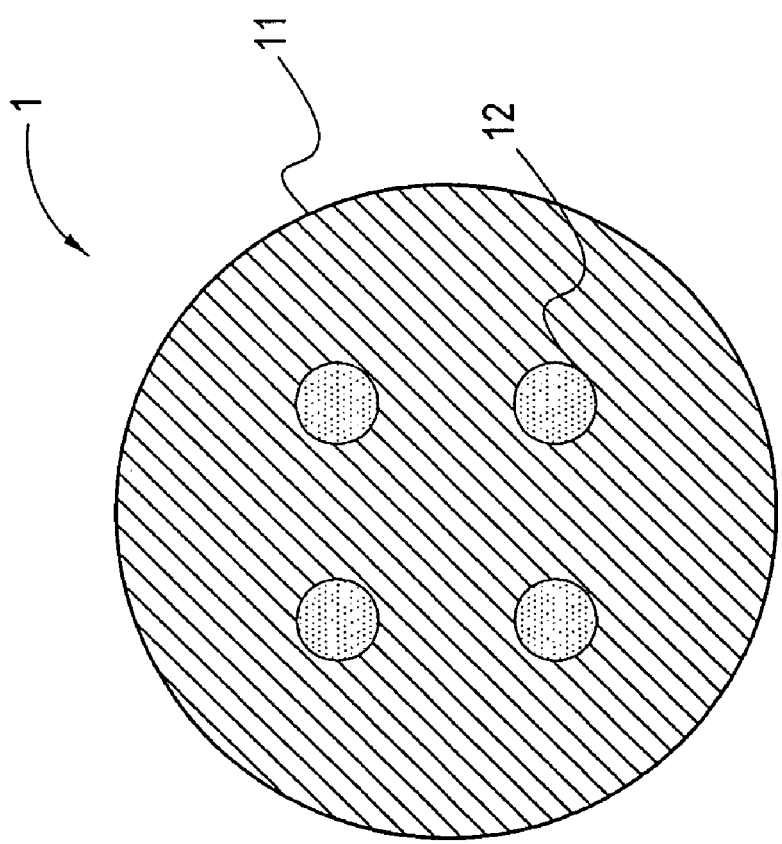

Referring to FIGS. 1A and 1B, structural views of the composite target material used in the method for producing the inventive diamond-like carbon film having semiconducting property indicate that the composite target material 1 comprises mainly:

a graphite target material 11;

a plurality of boron tablets 12 inserted in the graphite target material 11, wherein the purity of said plurality of boron tablets 12 are higher than 95%, and are used as a dopant source, wherein the doping level is adjusted with surface area ratio of said plurality of boron tablets 12 to said graphite target material 11; said boron tablets 12 filler comprising 0.1% to 40% of entire target material area, and said graphite target material comprising 0.1% to 60% by volume of entire target material; wherein said boron tablets 12 can be inserted within a graphite target material 11 carbon target material in a form of circular, rectangular or any other shape; and wherein said dopant source in said diamond-like carbon thin film may be selected from the group consisting of boron (B), boron carbide ($B_4C$), diboron trioxide ($B_2O_3$), boron nitride (BN) and other boron compounds; said other boron compounds used as the doping elements for the diamond-like carbon is selected from the group consisting of boron (B), lithium (Li) and beryllium (Be);

a copper plate 2, provided below said composite target material 1 for supporting said composite target material 1;

wherein after providing said composite target material 1, a sputtering process for said semiconducting diamond-like carbon film is carried out at a sputtering power of 300 W, and argon is introduced as gas for generating plasma; a boron-doped carbon thin film is deposited on a high impedance substrate, wherein said substrate for the diamond-like carbon film is a un-doped silicon wafer, glass or other substrate, and its temperature is in the range of 250° C. to 800° C.; said semiconducting diamond-like carbon film is annealed at 500° C., and the resulting semiconducting diamond-like carbon film is then subjected to analysis of semiconductor property on such as a Hall effect measuring system (HMS-3000 MANUAL Ver. 3.1) to measure surface resistivity of the thin film, its carrier concentration and migration rate; wherein said boron doped semiconducting diamond-like carbon film exhibits a polarity of p-type semiconductor and a high carrier concentration that is consistent with the required standard for use of a semiconductor element.

Since the surface area of the boron tablet used for doping and the thickness of the thin film deposited therefrom might affect the properties of the semiconducting diamond-like carbon film, three examples were carried out with respect to three different area ratios of boron tablet to carbon target (0%, 6%, 12.5%) as described below which, however, would not be construed as limiting the scope of the invention.

EXAMPLES

Example 1

In this example, surface area ratio of boron tablet to carbon target was 0%, sputtering power was 300 W, and argon was introduced as gas for exciting plasma. After depositing diamond-like carbon film on a high impedance silicon substrate, the diamond-like carbon film was annealed at 500° C. and then was subjected to semiconductor test and analysis (Table 1). The original n-type boron-free diamond-like carbon film remained as n-type semiconductor thin film morphology even after annealing at 500° C., while its carrier concentration increased slightly from $4.4 \times 10^{15}$ cm$^{-3}$ before annealing to $8.6 \times 10^{16}$ cm$^{-3}$ after annealing.

Example 2

In this example, surface area ratio of boron tablet to carbon target was 6%, sputtering power was 300 W, and argon was introduced as gas for exciting plasma. After depositing diamond-like carbon film on a high impedance silicon substrate, the diamond-like carbon film was annealed at 500° C. and then was subjected to semiconductor test and analysis (Table 1). The original n-type boron-free diamond-like carbon film was transformed into p-type semiconductor thin film morphology after annealed at 500° C., while its carrier concentration increased from $4.7 \times 10^{15}$ cm$^{-3}$ before annealing to $1.3 \times 10^{18}$ cm$^{-3}$ after annealing. The transformation into p-type semiconductor thin film morphology has taken place based on the heat motion and heat diffusion of the boron and carbon atoms induced by the heat energy provided in the annealing treatment, resulting in boron-carbon bonding and p-type semiconductor properties.

Example 3

In this example, surface area ratio of boron tablet to carbon target was 12.5%, sputtering power was 300 W, and argon was introduced as gas for exciting plasma. After depositing diamond-like carbon film on a high impedance silicon substrate, the diamond-like carbon film was annealed at 500° C. and then was subjected to semiconductor test and analysis (Table 1). The original n-type boron-free diamond-like carbon film had been transformed into p-type semiconductor thin film morphology before annealing at 500° C., and remained as p-type semiconductor thin film morphology after annealing, while its carrier concentration increased slightly from $4.3 \times 10^{15}$ cm$^{-3}$ before annealing to $2.4 \times 10^{16}$ cm$^{-3}$ after annealing.

TABLE 1

Hall effect analysis of boron-doped diamond-like carbon film.

| | | | | | |
|---|---|---|---|---|---|
| Thin film as deposited | 0% | N | $4.4 \times 10^{15}$ | $1.5 \times 10^{3}$ | $8.9 \times 10^{-1}$ |
| | 6% | N | $4.7 \times 10^{15}$ | $1.2 \times 10^{3}$ | 1.1 |
| | 12.5% | P | $4.3 \times 10^{15}$ | $1.3 \times 10^{2}$ | 10 |
| Thin film after annealing | 0% | N | $8.6 \times 10^{16}$ | $3.9 \times 10^{2}$ | $1.9 \times 10^{-1}$ |
| | 6% | P | $1.3 \times 10^{18}$ | 7.9 | $6.2 \times 10^{-1}$ |
| | 12.5% | P | $2.4 \times 10^{16}$ | $1.6 \times 10^{2}$ | 1.6 |

B:C Area ratio: surface area ratio of boron to carbon; Type: polarity of thin film; carrier concentration: $N_b$; mobility: $\mu$; and resistivity: $\rho$.

Figure 2:
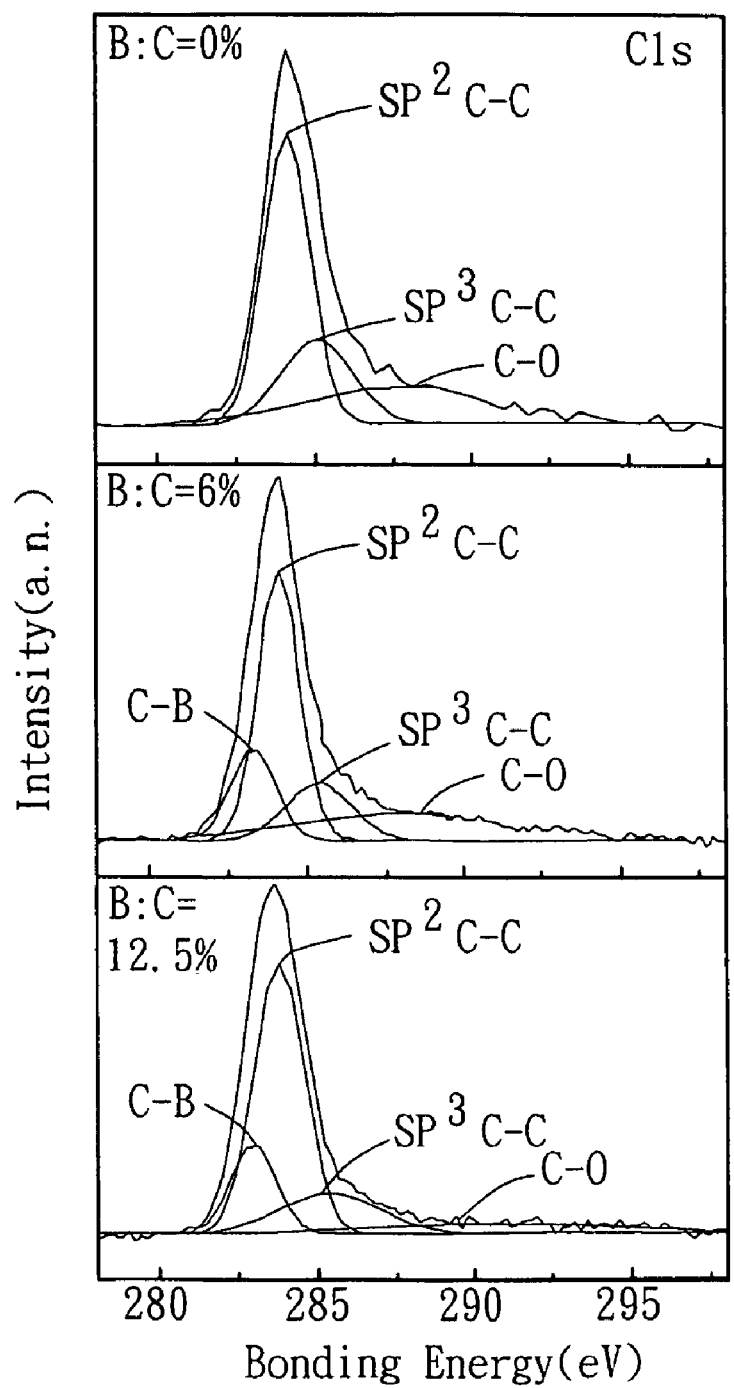
FIG. 2 is an XPS spectra in the C1s region obtained in the XPS analysis of the diamond-like carbon film produced by the inventive method for production of diamond-like carbon film having semiconducting property.

Referring to FIG. 2, these were XPS scanning spectra in the C1s region obtained in the XPS analysis of the diamond-like carbon film produced by the inventive method for production of diamond-like carbon film having semiconducting property. Sputtering conditions used were: surface area ratio of boron tablet to carbon target material was 0%, 6%, and 12.5%, respectively; sputtering power was fixed at 300 W, argon was introduced as gas for exciting plasma, and the diamond-like carbon film thus deposited on the high impedance silicon substrate was subjected to X-ray photo-electronic spectroscopy (XPS) analysis. It is known from the figures that, after Gaussian peak analysis, the data in the C1s region of the XPS spectra from the original boron-free diamond-like carbon film (surface area ratio of boron table to carbon target was 0%) exhibit sp$^2$, sp$^3$ and C—O bond-specific peaks having bond energy of 284.4 eV, 285.3 eV and 287.9 eV, respectively. On the other hand, after being doped with surface area ratio of boron tablet to carbon target of 6% and 12.5%, a C—B bond signal was found at position corresponding to bond energy of 282.9 eV. Further, it was also found from spectra that as bond ratio of sp$^2$/sp$^3$ might be increased as the amount of doped boron was increased, the abundance of sp$^2$ tended to increase, whereby, as the surface area ratio of boron to carbon was increased to be 12.5%, sp$^2$/sp$^3$ ratio reached at 10.54 (Table 2). Accordingly, it was suggested that boron atoms might bond with graphitic carbon atoms under doping action, thereby increased the abundance of sp$^2$.

TABLE 2

Bond energy analysis on the X-ray photo-electron spectra of boron-doped

| B:C | sp$^2$ C-C (ev) | sp$^3$ C-C (ev) | C-B (ev) | C-O (ev) | sp$^2$/sp$^3$ |
|---|---|---|---|---|---|
| 0% | 284.4 | 285.3 | — | 287.9 | 2.21 |
| 6% | 284.3 | 285.4 | 282.9 | 287.7 | 2.61 |
| 12.5% | 284.3 | 285.4 | 282.9 | 287.7 | 10.54 | diamond-like carbon film.*

*Numerical values in this Table stand for the bond energy positions indicated by Gaussian peaks.

Figure 3:
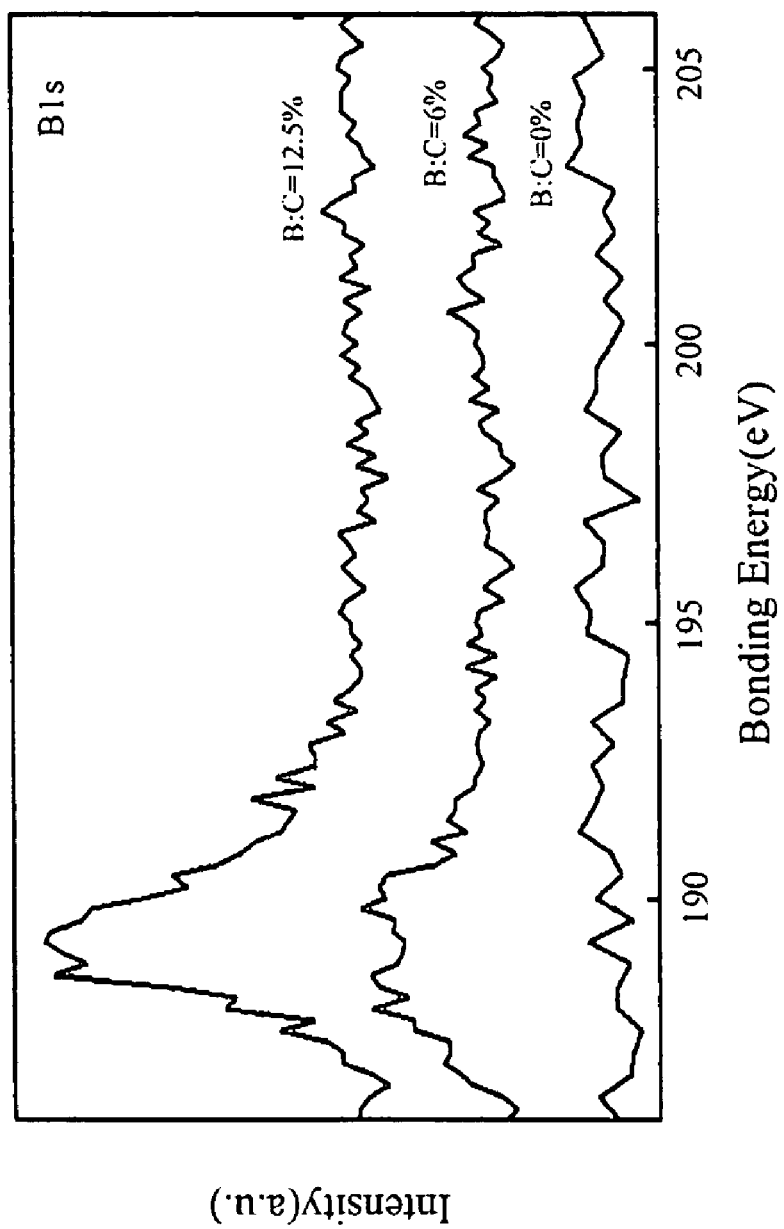
FIG. 3 is a XPS spectra in the B1s region obtained in the XPS analysis of the diamond-like carbon film produced by the inventive method for production of diamond-like carbon film having semiconducting property.

Referring to FIG. 3, these were XPS scanning spectra in the B1s region obtained in the XPS analysis of the diamond-like carbon film produced by the inventive method for production of diamond-like carbon film having semiconducting property. It could be suggested from these spectra that, when sputtering conditions used were: surface area ratio of boron tablet to carbon target material was 0%, 6%, and 12.5%, respectively; sputtering power was fixed at 300 W, argon was introduced as gas for exciting plasma, and the diamond-like carbon film thus deposited on the high impedance silicon substrate was subjected to X-ray photo-electronic spectroscopy (XPS) analysis. It is known from the figures that, after slow scanning over the B1s region of 186 eV to 206 eV, the data in this B1s region revealed that boron actually doped in the diamond-like carbon film. In addition, as the doping ratio increased, the boron signal also tended to increase, which meant that boron atoms had successfully doped into the diamond-like carbon film.

In summary, the method for production of diamond-like carbon film having semiconducting property provided by the invention exhibits further following advantages over other conventional techniques:

1. The invention adopts magnetic-controlled sputtering process having high parameter stability and lower danger, and the composite target material used in the sputtering is formed from solid state graphite target material and boron tablet, wherein the boron table is inserted in the graphite target material, whereby a diamond-like carbon film can be co-deposited through co-sputtering, and at the same time, doping action of boron element can be carried out, so as to achieve characteristics of a p-type semiconducting diamond-like carbon film and high carrier concentration.
2. The invention is able to overcome the bottleneck of current nano-scale semiconductor materials, such as carrier concentration, carrier migration rate and heat dissipating performance of semiconductors can be improved by means of a semiconducting diamond-like carbon film according the invention.
3. The semiconducting diamond-like carbon film produced by the method for production of diamond-like carbon film having semiconducting property provided by the invention is applicable in semiconductor equipment and elements, such as conducting wires and electrodes in solar cells, semiconductor elements, and electronic equipment.

The foregoing is a specific description with respect to the possible embodiments according to the invention which, however, will not be construed as limiting the patentable scope of the invention, and equivalent embodiments or variation without departing from the spirit of the invention are intended to fall within the scope of the invention.

Accordingly, the invention not only innovates in technical ideas, but also has numerous effects over conventional articles, thereby meeting the legal patent requirements of novelty and non-obviousness, and thus deserves a patent right.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for production of diamond-like carbon film having semiconducting property, comprising:
   preparing a composite target material from a carbon target material and a boron, tablet placed within the carbon target material, and
   producing diamond-like carbon film having semiconducting property on a substrate by a physical vapor deposition process.

2. A method for production of diamond-like carbon film having semiconducting property, comprising:
   preparing a composite target material from a carbon target material and a boron tablet;
   carrying out a physical vapor deposition process to produce a diamond-like carbon film having semiconducting property, wherein argon gas is introduced for exciting plasma, and
   depositing a single layer of the diamond-like carbon film having semiconducting property on a substrate.

3. A method for production of diamond-like carbon film having semiconducting property, comprising:
   preparing a heterogeneous composite target material having a surface area comprising a carbon target material and a boron tablet, wherein the boron tablet is inserted in the carbon target material and comprises 0.1% to 40% of the surface area of the target material, and
   producing a diamond-like carbon film having semiconducting property on a substrate by a physical vapor deposition process.

4. A method for production of diamond-like carbon film having semiconducting property of claim 1, wherein said boron tablet is made from boron compounds selected from the group consisting of boron, boron carbides, boron oxides, and boron nitrides.

5. A method for production of diamond-like carbon film having semiconducting property of claim 1, wherein said composite target material is one selected from the group consisting of boron tablets inserted in a graphite target material or carbon target material.

6. A method for production of diamond-like carbon film having semiconducting property of claim 1, wherein said boron tablet comprises 0.1% to 40% of the total target material area.

7. A method for production of diamond-like carbon film having semiconducting property of claim 1, wherein the property of said semiconducting diamond-like carbon film is influenced by the area of said boron tablet and the deposition thickness of said thin film.

8. A method for production of diamond-like carbon film having semiconducting property of claim 1, wherein said composite target material is supported by a copper plate underneath.

9. A method for production of diamond-like carbon film having semiconducting property of claim 1, wherein said physical vapor deposition process is selected from the group consisting of magnetron sputtering, and cathode arc discharging deposition.

10. A method for production of diamond-like carbon film having semiconducting property of claim 1, wherein the physical vapor deposition process for producing said diamond-like carbon film having semiconducting property by a physical vapor deposition at a temperature of said substrate in a range from 250° C. to 800° C.

11. A method for production of diamond-like carbon film having semiconducting property of claim 1, wherein the last step of said method comprises a heat treatment step.

12. A method for production of diamond-like carbon film having semiconducting property of claim 4, wherein said boron compounds is replaced by doping elements selected from the group consisting of boron (B), lithium (Li) and beryllium (Be).

13. A method for production of diamond-like carbon film having semiconducting property of claim 5, wherein said boron tablet is inserted in said graphite target material or carbon target material in a circular, rectangular or any other shape.

14. A method for production of diamond-like carbon film having semiconducting property claim 13, wherein said graphite target material comprises 0.1% to 60% by the total target material volume.

* * * * *